US012560532B2

(12) United States Patent
Oh et al.

(10) Patent No.: US 12,560,532 B2
(45) Date of Patent: Feb. 24, 2026

(54) APPARATUS FOR MEASURING RADICAL DENSITY DISTRIBUTION BASED ON LIGHT ABSORPTION AND OPERATING METHOD THEREOF

(71) Applicant: SAMSUNG ELECTRONICS CO., LTD., Suwon-si (KR)

(72) Inventors: Sejin Oh, Suwon-si (KR); Sunggil Kang, Suwon-si (KR); Sangki Nam, Suwon-si (KR); Jeongmin Bang, Suwon-si (KR); Dougyong Sung, Suwon-si (KR); Yeongkwang Lee, Suwon-si (KR); Sungho Jang, Suwon-si (KR); Jonghun Pi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 18/202,663

(22) Filed: May 26, 2023

(65) Prior Publication Data

US 2024/0159657 A1      May 16, 2024

(30) Foreign Application Priority Data

Nov. 14, 2022    (KR) ........................ 10-2022-0151905

(51) Int. Cl.
*G01N 21/25*        (2006.01)
*G01N 21/31*        (2006.01)
*H01L 21/67*        (2006.01)

(52) U.S. Cl.
CPC ....... *G01N 21/255* (2013.01); *G01N 21/3103* (2013.01); *H01L 21/67069* (2013.01); *G01N 2201/061* (2013.01); *G01N 2201/062* (2013.01)

(58) Field of Classification Search
CPC ............. G01N 21/255; G01N 21/3103; G01N 2201/061; G01N 2201/062; G01N 21/31; G01N 21/359; G01N 2021/8411; H01L 21/67069; H01J 37/32972; H01J 2237/334; H01J 2237/335; G01J 3/02; G01J 3/28
(Continued)

(56) References Cited

U.S. PATENT DOCUMENTS 6,034,781 A      3/2000  Sarfaty et al.
8,358,416 B2    1/2013  Venugopal et al.
(Continued)

FOREIGN PATENT DOCUMENTS

CN        111211044 A  *  5/2020  ........ H01J 37/32917
JP          2926278 B2  *  7/1999
(Continued)

*Primary Examiner* — Md M Rahman
(74) *Attorney, Agent, or Firm* — Sughrue Mion, PLLC

(57)                    ABSTRACT

Provided is an apparatus configured to measure radical spatial density distribution including a process chamber including a viewport, a driving device configured to move a moving wall inside the process chamber, a light source configured to generate light, a collimator disposed in the viewport of the process chamber and configured to transmit light received from the light source to the moving wall and receive light reflected from the moving wall, and a spectrometer configured to receive the reflected light from the collimator, and measure radical spatial density based on analyzing an absorption amount of a spectrum of the received light.

20 Claims, 7 Drawing Sheets

10

(58) Field of Classification Search
USPC .......................................................... 356/326
See application file for complete search history.

(56) References Cited

U.S. PATENT DOCUMENTS

| | | | |
|---|---|---|---|
| 9,287,093 | B2 | 3/2016 | Singh et al. |
| 9,620,338 | B2 | 4/2017 | Samukawa et al. |
| 10,128,160 | B2 | 11/2018 | Sakiyama et al. |
| 10,481,005 | B2 | 11/2019 | Oh et al. |
| 10,892,145 | B2 | 1/2021 | Oh et al. |
| 10,892,198 | B2 | 1/2021 | Rodrigo et al. |
| 11,114,286 | B2 | 9/2021 | Lin et al. |
| 11,183,374 | B2 | 11/2021 | Kusano et al. |
| 11,264,219 | B2 | 3/2022 | Hwang et al. |
| 2009/0286342 | A1 * | 11/2009 | Takahashi ......... H01L 21/02581 438/32 |
| 2010/0089316 | A1 | 4/2010 | Saki |

FOREIGN PATENT DOCUMENTS

| | | | |
|---|---|---|---|
| JP | 4226392 | B2 | 12/2004 |
| JP | 2005257428 | A * | 9/2005 |
| KR | 10-1829811 | A | 2/2018 |

* cited by examiner

210

212

214

Moving

212

R_wall

1

APPARATUS FOR MEASURING RADICAL DENSITY DISTRIBUTION BASED ON LIGHT ABSORPTION AND OPERATING METHOD THEREOF

CROSS-REFERENCE TO RELATED APPLICATIONS

This application claims priority to Korean Patent Application No. 10-2022-0151905 filed on Nov. 14, 2022 in the Korean Intellectual Property Office, the disclosure of which is incorporated herein by reference in its entirety.

BACKGROUND

1. Field

Embodiments of the present disclosure related to an apparatus configured to measure radical spatial density distribution based on light absorption and an operating method thereof.

2. Description of Related Art

In general, various pulse methods are used to control an amount of ions and reactive gases, acting on a wafer in a plasma chamber in a semiconductor etching process. In particular, in high aspect ratio contact (HARC) etching, a gas pulsing method in which etching/deposition is repeatedly performed by adjusting an amount of etching gas introduced to a dry plasma etching chamber is used to improve an etching profile of a contact hole having a high aspect ratio. Controlling a flow rate of the reactive etching gas improves a reaction speed of controlling a gas supply amount in the chamber through the introduction of a selective gas supply system and improvement of a gas pipe. However, there is a limit in that a minimum period of a pulse may reach several seconds due to a transient time required for stabilization of gas distribution in the chamber.

SUMMARY

One or more embodiments provide an apparatus configured to measure radical spatial density based on light absorption using a single port and an operating method thereof.

One or more embodiments also provide an apparatus configured to measure radical spatial density, based on light absorption improving spatial resolution and an operating method thereof.

According to an aspect of an example embodiment, there is provided an apparatus configured to measure radical spatial density distribution including a process chamber including a viewport, a driving device configured to move a moving wall inside the process chamber, a light source configured to generate light, a collimator disposed in the viewport of the process chamber and configured to transmit light received from the light source to the moving wall and receive light reflected from the moving wall, and a spectrometer configured to receive the reflected light from the collimator, and measure radical spatial density based on analyzing an absorption amount of a spectrum of the received light.

According to another aspect of an example embodiment, there is provided an operating method of an apparatus configured to measure radical spatial density distribution based on light absorption, the operating method including moving a moving wall to a target position in a process chamber, and measuring radical spatial density based on reflective optical absorption spectroscopy, wherein measuring the radical spatial density based on the reflective optical absorption spectroscopy includes emitting light to a reflector of the moving wall, receiving light reflected from the reflector, analyzing a spectrum of the received light, and measuring an absorption amount of the spectrum.

According to another aspect of an example embodiment, there is provided a plasma etching process, including a process chamber configured to introduce etching gas, and etch a wafer by plasma formed by plasma source pulse and bias pulse, at least one power source configured to generate the plasma source pulse and the bias pulse, a driving device configured to control movement of a moving wall inside the process chamber, a light source configured to generate light, a collimator disposed in a viewport of the process chamber and configured to transmit light received from the light source to the moving wall and receive light reflected from the moving wall, a spectrometer configured to receive the reflected light from the collimator and analyze an absorption amount of a spectrum of the received light, and a main processor configured to control the at least one power source, the driving device, the light source, and the spectrometer, wherein the main processor is further configured to measure radical spatial density distribution by analyzing an absorption amount of the spectrometer while moving the moving wall to scan a space of the moving wall inside the process chamber.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, example embodiments will be described clearly and in detail with reference to the accompanying drawings by those skilled in the art.

According to an apparatus configured to measure radical spatial density distribution, based on light absorption and an operating method thereof according to an example embodiment, by introducing light to a chamber using an external light source and then receiving a signal reflected through a chamber wall, spatial density of radicals (active species) may be measured by measuring an absorption amount. In an apparatus configured to measure radical spatial density distribution, based on light absorption and an operating method thereof according to an example embodiment, by measuring radical spatial density while moving a chamber wall into a chamber, spatial scanning may be performed. An apparatus configured to measure radical spatial density distribution based on light absorption and an operating method thereof according to an example embodiment, enable facility operation without actual process interruption when measuring radical spatial density. In addition, the apparatus configured to measure radical spatial density distribution based on light absorption and an operating method thereof are implemented in a 2-path form due to light path reflection, and thus have relatively excellent spatial resolution.

Figure 1:
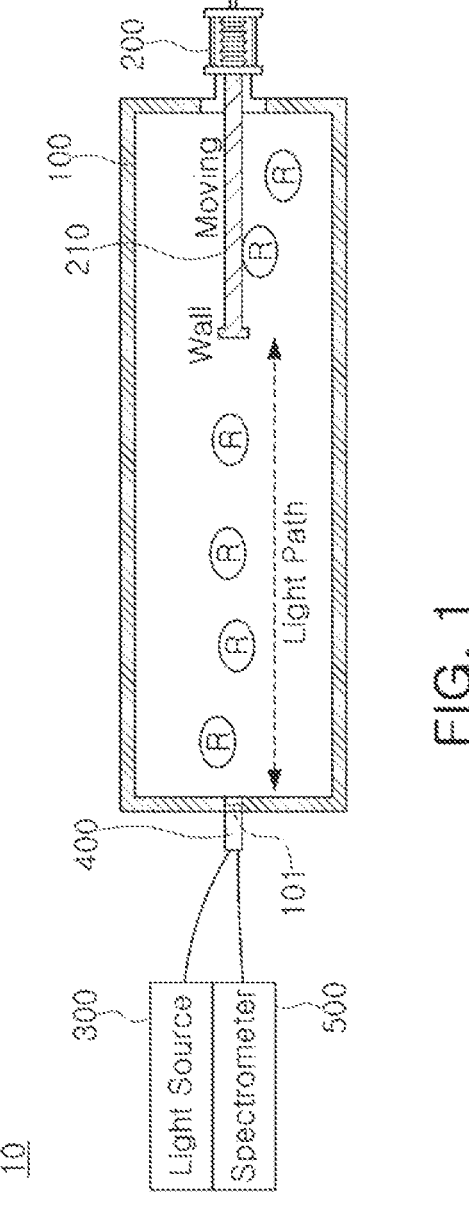
FIG. 1 is a diagram exemplarily illustrating an apparatus configured to measure radical spatial density based on light absorption according to an example embodiment.

FIG. 1 is a diagram exemplarily illustrating an apparatus configured to measure radical spatial density based on light absorption according to an example embodiment.

Referring to FIG. 1, an apparatus configured to measure radical spatial density distribution, based on light absorption according to an example embodiment may include a process chamber 100, a controller (driving device) 200, a light source 300, a collimator 400, and a spectrometer 500.

The process chamber 100 may be implemented to perform a semiconductor process by reacting at least one radical (active species). In an example embodiment, the process chamber 100 may be a chamber for a dry cleaning process or a dry etching process.

The controller 200 may move a moving wall 210 disposed on one side surface of the process chamber 100. The moving wall 210 may cross an inside of the process chamber 100. The controller 200 may extend or contract a length of the moving wall 210 in one direction. The controller 200 may be implemented in a step motor method or a manual method. The controller 200 may include a step motor.

The light source 300 may generate light necessary for analyzing radicals. In an example embodiment, the light source 300 may be implemented as a Xenon Flash Lamp or a Light Emitting Diode (LED) lamp. In order to check stability of the light source 300, reference light of the light source itself may be monitored in real-time.

The collimator 400 may introduce light output from the light source 300 to the moving wall 210 inside the process chamber 100. In addition, the collimator 400 may receive incident light reflected from the moving wall 210. The collimator 400 may be disposed in a port 101 of the process chamber 100.

The spectrometer 500 may receive reflected light from the collimator 400, and measure a spectrum of the reflected light received from the collimator 400 to calculate spatial density of radicals. The spectrometer 500 may measure a spectrum in a range from ultraviolet (UV) to near-infrared (NIR). In an example embodiment, the spectrometer 500 may measure a spectrum having a wavelength range of 200 nm to 1800 nm. The spectrometer 500 may measure the radical spatial density through the Beer-Lambert Law, by measuring an absorption amount in the radical wavelength band. Here, the Beer-Lambert Law satisfies the following Equation 1.

$$\frac{I_t}{I_0}(\lambda) = \exp(-A(\lambda N)) \qquad \text{[Equation 1]}$$

Here, $I_0$ is intensity of light emitted from the light source 300, and $I_t$ is intensity of light received from the spectrometer 500. A is an absorption rate, N is a concentration of radicals, and 2 is a distance from the light source 300 to the moving wall 210.

As the moving wall 210 moves, it is possible to measure the density of radicals according to a difference in light paths.

An apparatus configured to measure radical spatial density in a general plasma chamber is made in a form of a probe, by applying light on a surface on one side of the probe, having a spectrometer on an opposite side of the probe, and performing scanning a space between the probe and the spectrometer, the density may be measured by an optical absorption spectroscopy (OAS) method. However, such an apparatus configured to measure radical spatial density may not be suitable to be applied to an actual mass-produced process chamber. For actual measurement, due to a structure of a probe head, the apparatus may need to be installed in an open chamber which may not be measurable when a facility is operated without actual process interruption. In addition, the apparatus configured to measure radical spatial density may have a large size due to a complicated measurement system, and spatial resolution thereof may be relatively poor.

On the other hand, an apparatus configured to measure radical spatial density 10 according to an example embodiment may apply light from a single port 101 into the process chamber 100 as an external light source, and measure radical spatial density by measuring the absorption amount of the reflective spectrum. In addition, the apparatus configured to measure radical spatial density 10 according to an example embodiment may measure radical spatial density through the moving wall 210. In addition, the apparatus configured to measure radical spatial density 10 according to an example embodiment may increase spatial resolution by doubling the light path through reflection of the moving wall 210.

Figure 2A:
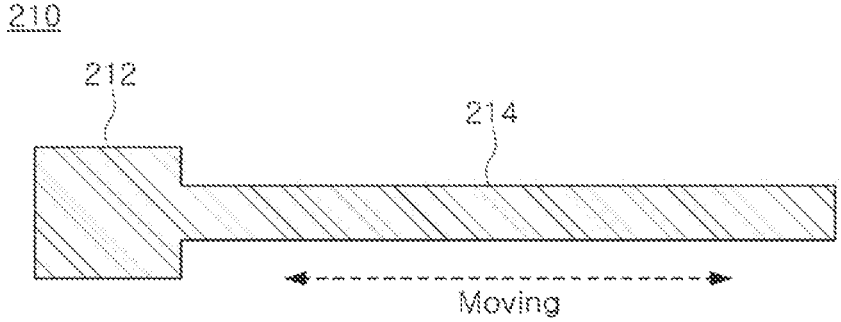
FIGS. 2A and 2B are diagrams exemplarily illustrating a moving wall according to an example embodiment.
Figure 2B:
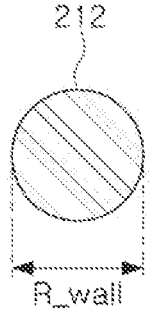

FIGS. 2A and 2B are diagrams exemplarily illustrating a moving wall 210 according to an example embodiment. Referring to FIG. 2A, the moving wall 210 may include a reflector 212 and an elastic pillar 214.

The moving wall 210 may be implemented in a silicon-based form or a form coded with $Y_2O_3$, $YF_3$, or the like to the silicon-based form.

The reflector 212 may be implemented in a cylindrical shape. In an example embodiment, a diameter R_wall of the reflector 212 may be equal to or smaller than a diameter of the light source. In an example embodiment, the diameter of the reflector 212 may be 2 mm or less.

The elastic column 214 may be extended or contracted in one direction under the control of the external controller 200.

Figure 3:
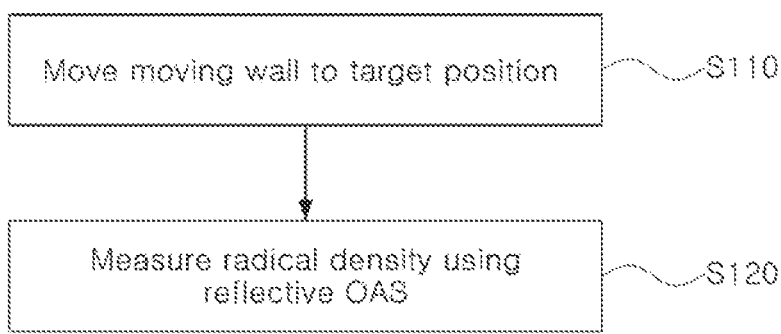
FIG. 3 is a flowchart illustrating an operation of an apparatus configured to measure radical spatial density 100 according to an example embodiment.

FIG. 3 is a flowchart illustrating an operation of an apparatus configured to measure radical spatial density 100 according to an embodiment. Referring to FIGS. 1 to 3, the operation of the apparatus configured to measure radical spatial density 100 may proceed as follows.

The controller 200 may move a moving wall 210 (see FIG. 1) to a target position (S110). The light source 300 may introduce light to the moving wall 210 at the target position through the collimator 400. Thereafter, the spectrometer 500 may receive light reflected from the moving wall 210. The spectrometer 500 may calculate spatial density of radicals using a reflective optical absorption spectroscopy (OAS) method according to incident light and reflected light (S120). Here, through the reflective OAS scheme, by introducing light from a reflector 212 (see FIG. 2) of the moving wall 2, receiving light reflected from the reflector 212, and measuring an absorption amount of a spectrum, radical spatial density is calculated.

In an example embodiment, a wavelength region of the spectrum may be 200 nm or more and 1800 nm or less. In an example embodiment, the process chamber 100 is used in a process of generating plasma or a process in which only gas is applied without plasma.

In an example embodiment, the reflector 212 may have a cylindrical shape, and the diameter of the reflector 212 may be less than or equal to the diameter of the incident light. In an example embodiment, the target position may be determined to perform scanning a space from one side surface of the process chamber 100 to the other side surface.

In a method for measuring radical spatial density according to an example embodiment, light emitted from an external light source 300 may be applied to the process chamber 100 through the collimator 400 mounted on a viewport 101 (see FIG. 1), the reflected light through the moving wall 210 inside the process chamber 100 may be received in the process chamber 100 again through the collimator 400, and an absorption amount of the corresponding radical wavelength band may be measured in the spectrometer 500, such that the radical spatial density of an entire light path up to the moving wall 210 may be measured using the measured absorption amount through the Beer-Lambert Law.

In the method for measuring radical spatial density according to an example embodiment, the radical density (N) of the light path continuously decreasing while the moving wall 210 moves into the process chamber 100 may be measured. In the method for measuring radical spatial density, a difference in radical density according to a difference in a light path through which the moving wall 210 moves is measured. In the method for measuring radical spatial density, the radical density distribution inside the process chamber 100 may be measured while the moving wall 210 moves to an opposite side wall where the external light source 300 is located.

Figure 4:
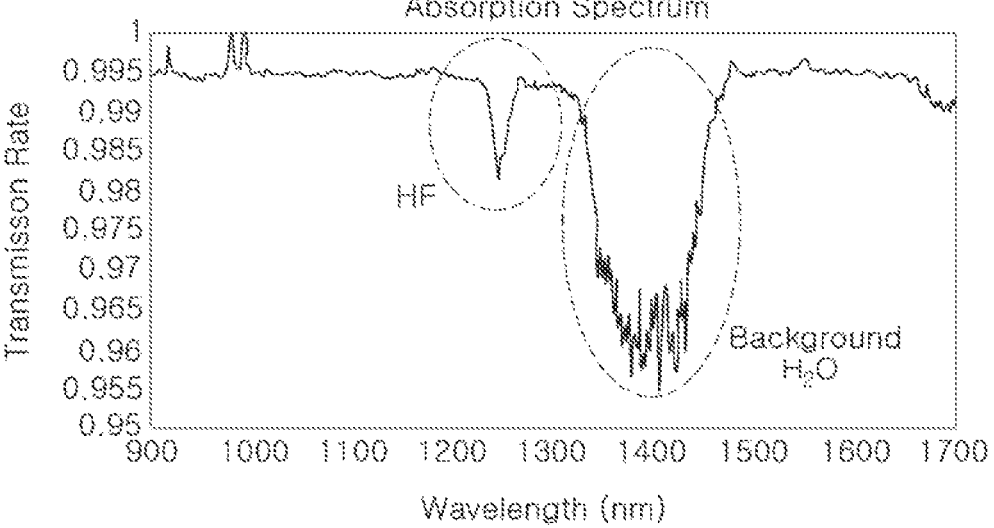
FIG. 4 is a diagram exemplarily illustrating radical measurement according to a reflective OAS scheme according to an example embodiment.

FIG. 4 is a diagram exemplarily illustrating radical measurement according to a reflective OAS scheme according to an example embodiment. As illustrated in FIG. 4, the well reflection-based (reflectance of 25%) OAS scheme can monitor hydrogen fluoride (HF) radicals in the process chamber region under dry cleaning process conditions.

Example embodiments of the present disclosure are applicable to a plasma etching apparatus.

Figure 5:
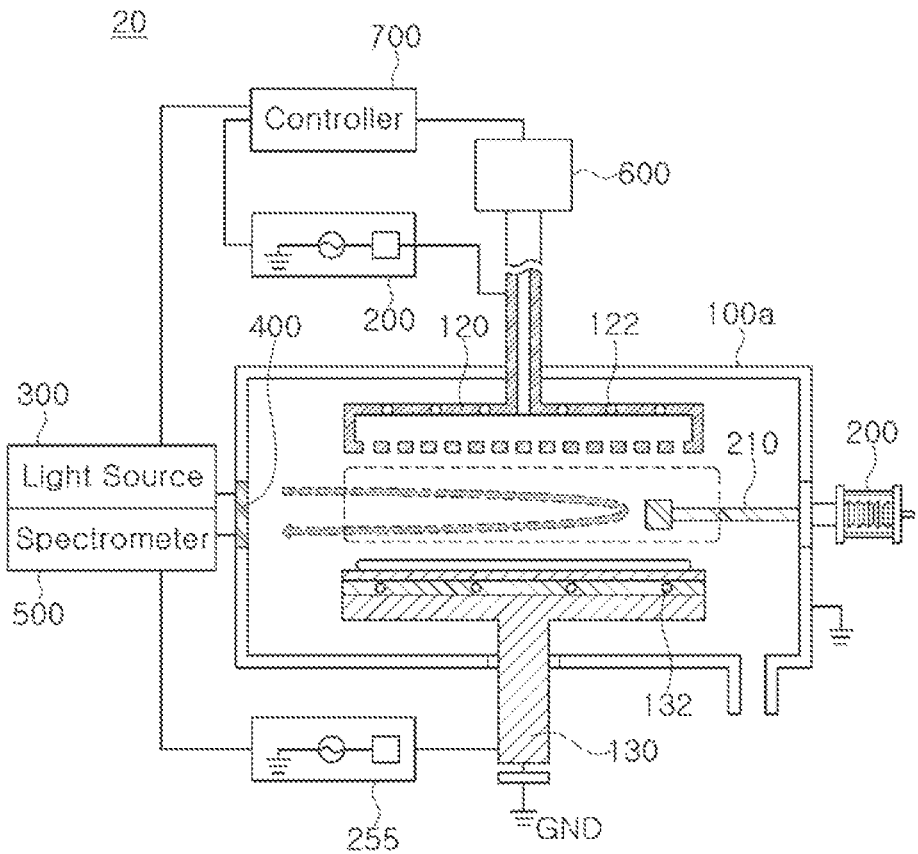
FIG. 5 is a diagram exemplarily illustrating a plasma etching apparatus according to an example embodiment.

FIG. 5 is a diagram illustrating a plasma etching apparatus 20 according to an example embodiment.

Referring to FIG. 5, the plasma etching apparatus 20 may include a process chamber 100a, a controller 200, power sources 250 and 255, a light source 300, a collimator 400, a spectrometer 500, a gas supply apparatus 600, and a main controller 700.

The process chamber 100a may have an internal space in which a semiconductor process is performed. The process chamber 100a is provided as an open solid made of a metal material having electrical conductivity and sufficient rigidity and strength, and may have an internal space for performing a plasma etching process therein. A source supply pipe for supplying source gas for etching may be disposed passing through an upper portion of the process chamber 100a, and an extension portion of the substrate fixing unit 130 may be disposed passing through a lower portion of the process chamber 100a externally of the process chamber 100a.

An upper insulator may be disposed between an upper plate of the process chamber 100a and a source supply pipe to insulate a space outside and inside the process chamber 100a. A lower insulator may be disposed between a bottom plate of the process chamber 100a and an extension portion of the substrate fixing unit 130 to insulate the space outside and inside the process chamber. A chamber gate for loading/unloading the substrate W to/from the substrate fixing unit 130 may be provided in a side portion of the process chamber 100a. While a plasma etching process is performed in the inner space, the process chamber 100a may be configured to be grounded by a grounding device.

An exhaust port may be disposed on a portion of the bottom plate of the process chamber 100a. For example, the exhaust port may be connected to a vacuum pump such that pressure inside the process chamber 100a may be adjusted by the exhaust port and a vacuum pump. In addition, process by-products and/or residual process gas generated in the process chamber 100a may be discharged through an exhaust port.

As illustrated in FIG. 5, the process chamber 100a may include a plasma generating unit 120 and a substrate fixing unit 130.

The plasma generating unit 120 may be disposed above the process chamber 100a. The plasma generating unit 120 may be connected to a gas supplying apparatus 600 having a source storage unit disposed external to the process chamber 100a, a flow controller, and the like to supply a source gas to perform plasma etching and be generated as etching plasma. In an example embodiment, the plasma generating unit 120 may include a source supply pipe supplying source gas, a shower head provided integrally with the source supply pipe and injecting the source gas into the process chamber 100a, and an upper electrode 122 disposed inside the shower head applying source power to generate source gas as plasma.

For example, the shower head may have a three-dimensional shape made of a metal material having relatively excellent conductivity, such as aluminum, and may have a plurality of injection holes on a rear surface for supplying source gas to an internal space. An upper electrode 122 configured to apply source power to form source gas into plasma may be disposed on the shower head. The upper electrode 122 may extend externally of the process chamber 100a along a source supply pipe and be electrically connected to the first power source 250. Accordingly, source gas for etching may be transmitted to the shower head through the source supply pipe, and may be injected into the internal space of the process chamber 100a through an injection hole. The source gas inside the process chamber 100a may be converted into plasma by power applied by the first and second power sources 250 and 255 to function as an etchant for etching.

The substrate fixing unit 130 may be disposed below the process chamber 100a to fix a substrate W to be etched. The substrate fixing unit 130 may be disposed below the process chamber 100a to correspond to the plasma generating unit 120. For example, the substrate fixing unit 130 may include an electrostatic chuck (ESC) or a vacuum chuck that fixes the substrate W by electrostatic force or vacuum. In an example embodiment, the substrate fixing unit 130 may include an electrostatic chuck having a susceptor to which a substrate W is fixed, a buried electrode disposed inside the susceptor to generate electrostatic force, and a lower electrode 132 configured to apply a bias voltage for generating source gas into plasma and inducing plasma to the substrate W.

Accordingly, when power for generating plasma is applied to the upper electrode 122 and the lower electrode 132, the source gas flowing in the internal space of the process chamber is converted into plasma in the internal space between the showerhead and the substrate W to form a plasma sheath between the substrate W and the showerhead.

The first power source 250 may be connected to one of the upper electrode 122 and the lower electrode 132 to provide high frequency power for converting source gas into plasma. For example, the first power source 250 may include a high frequency generator generating high frequency power and a first impedance matching transformer. The high frequency generator may generate high frequency power generating source gas supplied into the internal space of the process chamber 100a into capacitively coupled plasma. The first impedance matching converter may maximize transmission power by matching impedance of the high frequency power with impedance of an electrode connected to the high frequency generator. Accordingly, the transmission efficiency of the upper electrode 122 or the lower electrode 132 of the high frequency power generated by the high frequency generator can be maximized.

For example, a radio frequency power may be generated as radio frequency (RF) power having a frequency range of about 13.56 MHz to 2.45 GHz and a power range of about 30 W to 10000 W. In an example embodiment, the high frequency power is mainly generated to have a frequency of about 13.56 MHz to about 60 MHz.

The second power source 255 may be connected to any one of the upper electrode 122 and the lower electrode 132, and may be complemented to induce capacitively coupled plasma to the substrate W, and apply pulsed bias power having a duty ratio of 0.5 or less to the substrate fixing unit 130. For example, the second power source 255 may include a low frequency generator generating pulsed low frequency power and a second impedance matching transformer. The low-frequency generator generates capacitively coupled plasma from the source gas supplied to the internal space of the process chamber 100a and generates low-frequency power for inducing the plasma to the substrate. The second impedance matching converter may match impedance of the low frequency power with impedance of the electrode connected to the low frequency generator 265 to maximize transmission power. Accordingly, transmission efficiency of the upper electrode 122 or the lower electrode 132 of the low frequency power generated by the low frequency generator 265 may be maximized.

As illustrated in FIG. 5, the first power source 250 may be disposed above the process chamber 100a to be connected to the plasma generating unit 120, and the second power source 255 may be disposed below the process chamber 100a to be connected to the substrate fixing unit 130. In the plasma etching apparatus 20, the first power source 250 may be connected to the plasma generating unit 120 such that high frequency power may be directly applied to an upper electrode 122 and the second power source 255 may be connected to the substrate fixing unit 130 such that low-frequency power may be directly applied to a lower electrode 132. Accordingly, the second power source 255 may be connected to the substrate fixing unit 130 together with a ground terminal GND. In this case, a high-pass filter may be connected between the ground terminal (GND) and the substrate fixing unit 130 and adjusted such that only low-frequency power can be applied to the lower electrode 132. The high-frequency pass filter may pass high-frequency power while substantially blocking low-frequency power. Since the second power source 255 and the ground terminal GND are simultaneously connected to the substrate fixing unit 130, low-frequency power may be directly connected to the ground terminal GND. Accordingly, the low-frequency power may be applied to a lower electrode 132 without being grounded, but the high-frequency power applied to the substrate fixing unit 130 may be grounded (GS) by the high-frequency pass filter to prevent the high-frequency power from being applied to the lower electrode 132. For example, the high-frequency pass filter may be comprised of an RC circuit composed of a resistor and a capacitor or an LC circuit composed of a resistor and a coil.

RF power applied by either the upper electrode 122 or the lower electrode 132 may be inductively coupled to process gases to form a plasma in a reactive region on a semiconductor wafer substrate. Process gases supplied from the process gas supplier may etch materials on the semiconductor wafer substrate. In an example embodiment, the process gas may include $C_xF_y$. In an example embodiment, RF power applied from the upper electrode 122 may ignite plasma, and RF power applied from the lower electrode 132 may control ions, radicals, and the like, of the plasma.

The plasma etching apparatus 20 according to an example embodiment may measure radical spatial distribution while moving the moving wall 210 onto the internal space as described with reference to FIGS. 1 to 4, by controlling the controller 200, the light source 300, the collimator 400, and the spectrometer 500 in the main controller 700. In particular, the main controller 700 may measure the radical spatial density distribution by measuring a difference in radical density according to a difference in light paths.

Figure 6:
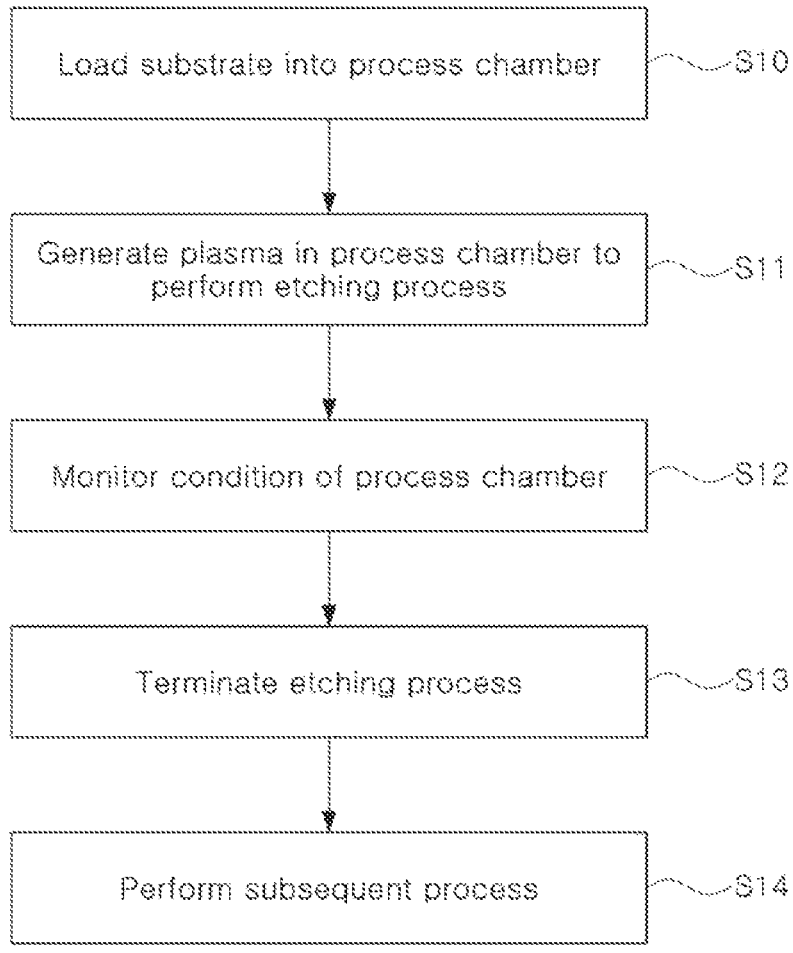
FIG. 6 is a flowchart illustrating an operation of a plasma etching apparatus according to an example embodiment.

FIG. 6 is a flowchart illustrating an operation of a plasma etching apparatus according to an example embodiment. Referring to FIGS. 5 and 6, the plasma etching apparatus may operate as follows.

A substrate W may be loaded into a process chamber 100a (S10). The substrate W may be seated on a substrate fixing unit 130. An elevating member for loading the substrate W, or the like, may be provided. An etching process may be performed by generating plasma in the process chamber 100a (S11). Performing the etching process may include introducing reference light to the process chamber 100a and generating plasma. Introducing reference light to the process chamber 100a and generating plasma may be simultaneously performed.

A state of the process chamber 100a may be monitored and an etching end point of the process chamber 100a may be detected (S12). Monitoring the state of the process chamber 100a and detecting the etching end point may include analyzing plasma light and reference light, detecting the etching end point, and compensating for the etching end point. For example, the main controller 700 may measure radical spatial density distribution using a reflection optical absorption spectroscopy (OAS) method as described in FIGS. 1 to 6. Through this spatial density distribution, the etching end point is confirmed.

When such an etching end point is confirmed, the main controller 700 may stop an etching process (S13). Since the etching end point indicates that a non-etching target film is exposed, the etching process may be immediately stopped after confirming the etching end point. Thereafter, the main controller 700 may perform a subsequent process on the substrate W (S14). For example, the subsequent process may be a cleaning process, or the like. However, it should be understood that the subsequent process according to embodiments are not limited thereto. If necessary, the subsequent process may be performed on the substrate W in the same process chamber 100a, or may be unloaded and moved to another process chamber.

Figure 7:
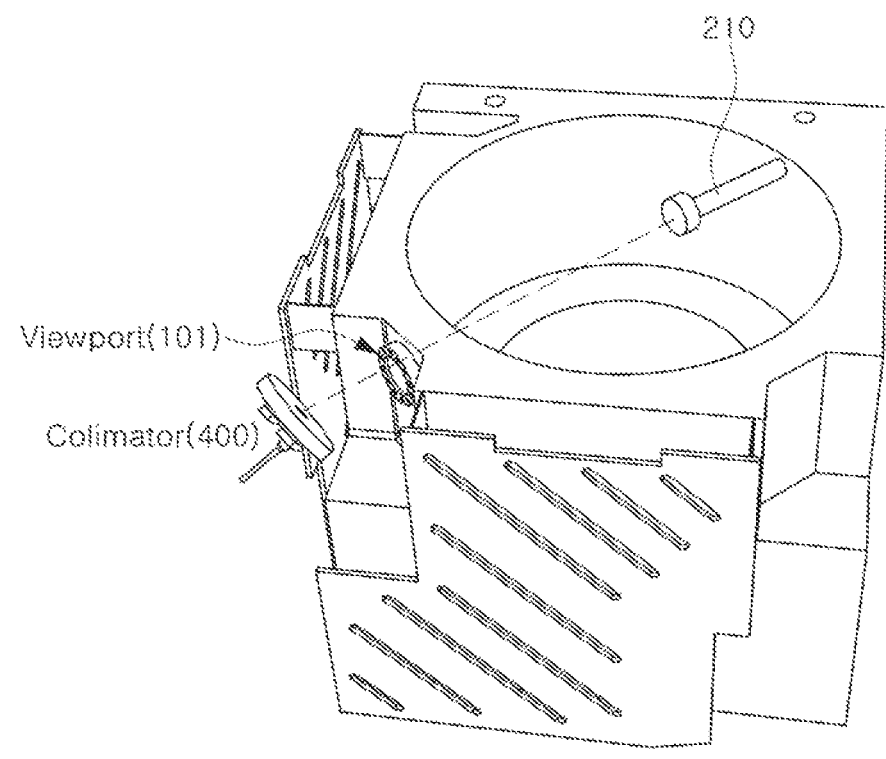
FIG. 7 is a diagram exemplarily illustrating a collimator according to an example embodiment.

FIG. 7 is a view exemplarily illustrating a collimator according to an example embodiment.

As illustrated in FIG. 7, a collimator may be coupled to a viewport 101 of the process chamber. A moving wall 210 may be disposed on a surface opposite to a side surface on which a collimator 400 is disposed.

Figure 8:
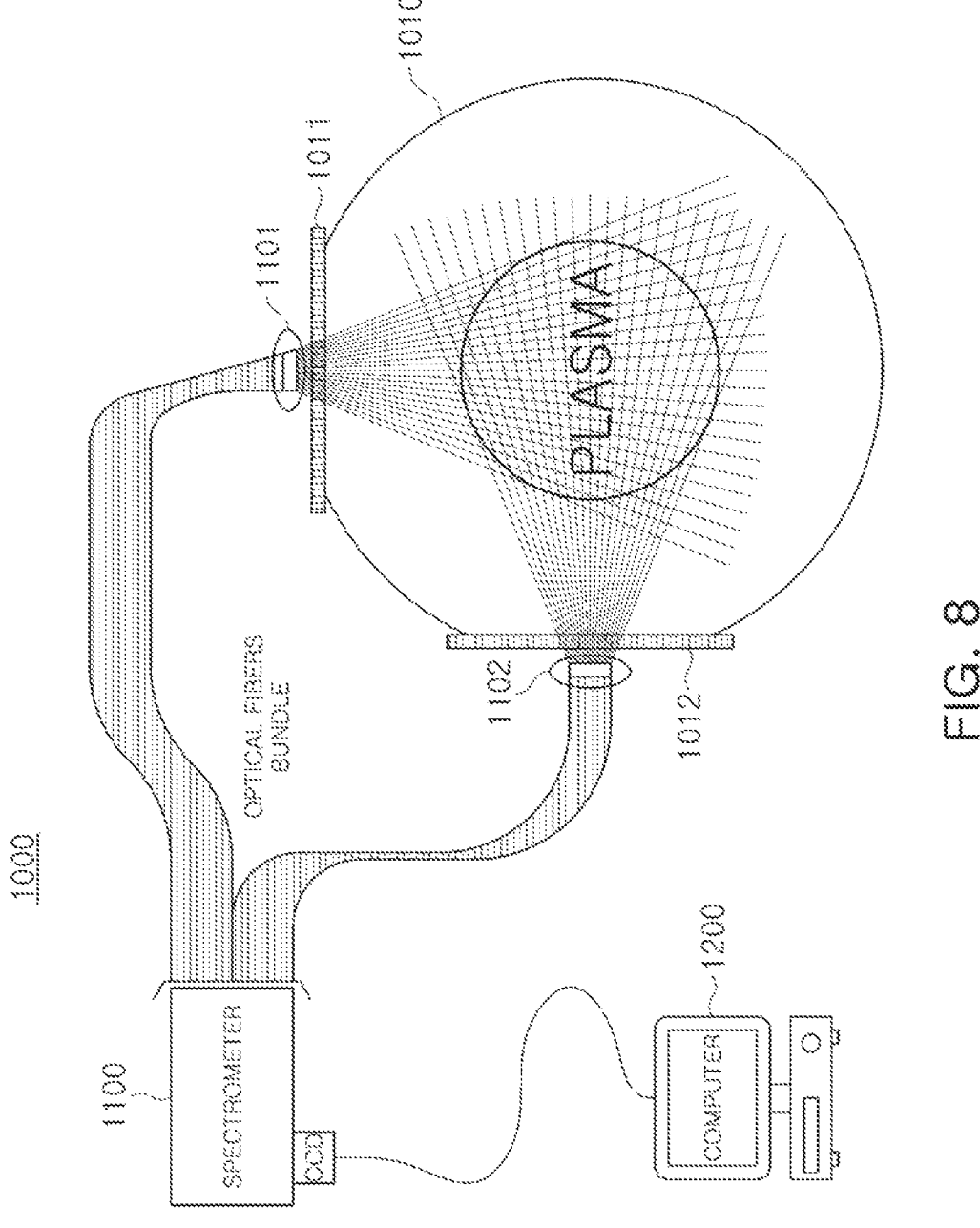
FIG. 8 is a diagram schematically illustrating a spectrotomography plasma diagnosis apparatus according to an example embodiment.

FIG. 8 is a diagram exemplarily illustrating a spectrotomography plasma diagnosis apparatus according to an example embodiment. Referring to FIG. 8, a spectrotomography plasma diagnosis apparatus 1000 may include a plasma process chamber 1010, a spectrograph 1100, and a computing device 1200.

As described with reference to FIGS. 1 to 7, the plasma process chamber 1010 may measure radical spatial density using a reflection OSA method while moving a wall in an internal space of the plasma process chamber 1010.

The spectrometer 1100 may be connected to first and second collimators and mechanical holders 1101 and 1102 through an optical channel. The first and second collimators and mechanical holders 1101 and 1102 may be disposed on windows 1011 and 1012 disposed and extending in different directions from each other.

The computing device 1200 may be implemented to analyze a chemical species distribution or chemical species behavior using spectral data analyzed by the spectrometer 1100. The spectrometer 1100 may be connected to the plasma process chamber 1010 through an optical channel. The spectrometer 1100 may be implemented to analyze chemical species and the behavior thereof by performing spectrum analysis on each of states of a multi-level pulse (or RF power) of the plasma process chamber 1010 in real time. For example, the spectrometer 1100 may be implemented to synchronize to a multi-level pulse, and analyze a spectrum thereof according to each of the states through an image sensor (CMOS image sensor, CCD image sensor, and the like). Here, each of the states may correspond to levels of the multi-level pulse. In addition, the spectrometer 1100 may be implemented to convert an output signal of an image sensor into logarithm. The synchronizer 1100 may be implemented to receive a trigger signal from the outside and synchronize control signals for controlling the spectrometer 1100 in response to the trigger signal.

The computing device 1200 may include at least one processor driving a program and a memory device storing the program. The processor may be implemented to perform spectral analysis related to the distribution of chemical species or the behavior of chemical species for each state of the multi-level pulse. As described above, the processor may control signals in response to a synchronization signal corresponding to each of the states of the multi-level pulse, receive an optical signal in response to the control signals, and execute a series of instructions to perform spectral analysis on the received optical signal. The memory may be implemented to store computer readable instructions. As the instructions stored in the memory are executed in the processor, the afore-mentioned operations may be performed. The memory may be a volatile memory or non-volatile memory. The memory may include a storage device to store user data.

The example embodiments described above may be implemented with a hardware component, a software component, and/or a combination of a hardware component and a software component. For example, the device, method, and component described in the example embodiments may be implemented using one or more general-purpose computers and special purpose computers such as, processors, controllers, arithmetic logic units (ALUs), digital signal processors, microcomputers, field programmable gate arrays (FPGAs), programmable logic units (PLUs), microprocessors, or any other device capable of executing and responding to instructions. The processing device may execute an operating System (OS) and one or more software applications running on the operating system.

In addition, the processing device may also access, store, manipulate, process, and generate data in response to execution of the software. For convenience of understanding, it can be seen that, although one processing device is sometimes described as being used, one of ordinary skill in the art will recognize that the processing device may include a plurality of processing elements and/or a plurality of types of processing elements. For example, the processing device may include a plurality of processors or one processor and one controller. Other co-processor configurations are also possible, such as a parallel processor.

The software may include a computer program, code, instructions, or a combination of one or more thereof, and configure the processing device to operate as desired or command the processing device independently or collectively. Software and/or data may be permanently or temporarily embodied on any type of machine, component, physical device, virtual equipment, computer storage medium or device, or transmitted signal waves, to be interpreted by or provide instructions or data to the processing device. The software may be distributed over a computer system connected via a network, and stored or executed in a distributed manner. The software and data may be stored in one or more computer-readable recording media.

In the apparatus and method according to an example embodiment, radicals may be measured/checked in an actual process facility by a chamber wall reflection-based OAS scheme. The apparatus and method according to embodiments may be applied in a facility using plasma. According to apparatus and method according to embodiments, in a semiconductor dry cleaning or dry etching process facility, radical spatial density distribution in a chamber may be measured by applying light into the chamber with an external light source from a single viewport, measuring active species density by measuring an absorption amount of a spectrum reflected through a wall in the chamber, and performing scanning a space of the wall while moving the wall into the chamber.

In an example embodiment, the external light source may be a Xenon Flash lamp or an LED lamp. In an example embodiment, the wall may include silicon (Si), or Si coated with yttrium oxide ($Y_2O_3$), yttrium fluoride ($YF_3$), or the like, to the corresponding-based form. In an example embodiment, the reflector may have a circular structure and have a diameter of 2 mm or less. In an example embodiment, spectrum measurement may be configured in a range from UV to NIR. In an example embodiment, the wavelength range may be 200 nm or more and 1800 nm or less. In an example embodiment, the process may include both a process in which plasma is generated and only gas is applied without plasma. In an example embodiment, the absorption amount may be calculated using a difference between lamp emission light and receiving light using the Beer-Lambert Law. In an example embodiment, with a wall may be moved by a step motor or based on a manual method. In an example embodiment, the diameter of the wall may be configured to be less than a diameter of external light source light in a circular shape. In an example embodiment, a function of monitoring of reference light of the light source itself in real-time may also be included to check stability of the light source.

The above-described embodiments are only example embodiments. The present disclosure will include technical ideas, which are abstract and conceptual ideas that can be used as technology in the future, as well as concrete and practically usable means themselves.

As set forth above, according to an example embodiment, in an apparatus configured to measure radical spatial density distribution, based on light absorption based on light absorption and an operating method thereof, when measuring radical spatial density, a facility may operate without actual process interruption.

In addition, the apparatus configured to measure radical spatial density distribution based on light absorption and an operating method thereof, may be implemented in a 2-path form due to reflection of a light path, and thus have relatively excellent spatial resolution.

The various advantages and effects of the present disclosure are not limited to the above description. While example embodiments have been shown and described above, it will be apparent to those skilled in the art that modifications and variations could be made without departing from the scope of the present inventive concept, as defined by the appended claims and their equivalents.

What is claimed is:

1. An apparatus for plasma etching, comprising:
a process chamber comprising a viewport;
a motor configured to move a moving wall inside the process chamber;
a light source configured to generate light; and
a spectrometer configured to receive the reflected light from the viewport, and measure radical spatial density based on analyzing an absorption amount of a spectrum of the received light,
wherein the viewport of the process chamber is configured to transmit light received from the light source to the moving wall, receive light reflected from the moving wall, and transmit the received light reflected to the spectrometer.

2. The apparatus of claim 1, wherein the process chamber is a chamber for a dry cleaning process or a dry etching process.

3. The apparatus of claim 1, further comprising:
a main processor configured to measure radical spatial density distribution inside the process chamber by controlling the motor, the light source, and the spectrometer, to measure the absorption amount of the spectrum while moving the moving wall to cross an inside of the process chamber.

4. The apparatus of claim 1, wherein the light source comprises a Xenon flash lamp or an LED lamp.

5. The apparatus of claim 1, wherein the moving wall includes silicon (Si) or sSi coated with yttrium oxide ($Y_2O_3$) or yttrium fluoride ($YF_3$) to the silicon.

6. The apparatus of claim 1, wherein the moving wall comprises a reflector having a cylindrical structure, and
wherein a diameter of the reflector is less than or equal to 2 mm.

7. The apparatus of claim 1, wherein the spectrometer is configured to analyze the spectrum in a near infrared (NIR) range to an ultraviolet (UV) range.

8. The apparatus of claim 1, wherein the absorption amount of the spectrum is obtained based on a difference between light generated by the light source and received light based on the Beer-Lambert Law.

9. The apparatus of claim 1, wherein the motor is further configured to control the movement of the moving wall based on a step motor method or a manual method.

10. The apparatus of claim 1, wherein reference light of a light source is monitored in real time to obtain stability of the light source.

11. An apparatus for plasma etching comprising a computing device, which is configured to execute a radical spatial density distribution measurement operation on a processor, wherein the radical spatial density distribution measurement operation comprises:
moving a moving wall to a target position in a process chamber; and
measuring radical spatial density based on reflective optical absorption spectroscopy,
wherein measuring the radical spatial density based on the reflective optical absorption spectroscopy comprises:
emitting light to a reflector of the moving wall;
receiving light reflected from the reflector;
analyzing a spectrum of the received light; and
measuring an absorption amount of the spectrum.

12. The apparatus of claim 11, wherein the spectrum has a wavelength region greater than or equal to 200 nm and less than or equal to 1800 nm.

13. The apparatus of claim 11, wherein the process chamber is configured to generate plasma or apply gas without plasma.

14. The apparatus of claim 11, wherein the reflector has a cylindrical shape, and
wherein a diameter of the reflector is less than or equal to a diameter of the light.

15. The apparatus of claim 11, wherein the target position is determined to scan a space from a first side surface to a second side surface of the process chamber.

16. An apparatus for plasma etching, comprising:
a process chamber configured to introduce etching gas, and etch a wafer by plasma formed by plasma source pulse and bias pulse;
at least one power source configured to generate the plasma source pulse and the bias pulse;
a motor configured to control movement of a moving wall inside the process chamber;
a light source configured to generate light;
a spectrometer configured to receive the reflected light from the viewport and analyze an absorption amount of a spectrum of the received light; and
a main processor configured to control the at least one power source, the motor, the light source, and the spectrometer,
wherein the viewport of the process chamber is configured to transmit light received from the light source to the moving wall, receive light reflected from the moving wall, and transmit the received light reflected to the spectrometer, and
wherein the main processor is further configured to measure radical spatial density distribution by analyzing an absorption amount of the spectrometer while moving the moving wall to scan a space of the moving wall inside the process chamber.

17. The apparatus of claim 16, wherein the absorption amount is obtained based on the Beer-Lambert Law.

18. The apparatus of claim 16, wherein the motor comprises a step motor.

19. The apparatus of claim 16, wherein the moving wall has a diameter less than or equal to 20 nm.

20. The apparatus of claim 16, wherein the main processor is configured to measure the radical spatial density distribution based on measuring a difference in radical density due to a difference in a light path.

\* \* \* \* \*